ated Patent

United States Patent [19]
Winogrocki et al.

[11] Patent Number: 4,516,824
[45] Date of Patent: May 14, 1985

[54] LAMP SOCKET ASSEMBLY FOR MOUNTING ON PRINTED CIRCUIT BOARD

[75] Inventors: Ray F. Winogrocki, East Detroit, Mich.; Daniel J. DuRocher, Nauvoo, Ill.

[73] Assignee: Essex Group, Inc., Fort Wayne, Ind.

[21] Appl. No.: 561,421

[22] Filed: Dec. 14, 1983

[51] Int. Cl.$^3$ .............................................. H02B 1/02
[52] U.S. Cl. ............................... 339/126 R; 339/170; 339/108 L
[58] Field of Search ........... 339/180 L, 125 L, 126 R, 339/126 RS, 170

[56] References Cited

U.S. PATENT DOCUMENTS

| | | | |
|---|---|---|---|
| 2,239,451 | 4/1941 | Stearns | 339/108 L |
| 4,040,709 | 8/1977 | Dola et al. | 339/125 L |
| 4,373,771 | 2/1983 | Cross et al. | 339/125 L |

Primary Examiner—Eugene F. Desmond
Attorney, Agent, or Firm—Stephen A. Schneeberger

[57] ABSTRACT

A lamp socket assembly for use with a printed circuit, particularly where the mounting aperture in the circuit board is relatively small and the board may be remotely located. The assembly includes a lamp socket and a separate key member. The key receives the socket in latched relation therewith, the latching arrangement being such as to afford limited longitudinal displacement of the socket relative to the key. One or more biasing members, such as cantilevered spring fingers, are formed integrally with the socket, or preferably the key, and act to urge the socket relatively forward from the key. Electrical leads from the lamp pass over a flange formed at the base of the socket and are urged upwardly with the base into good electrical contact with the printed circuit on the under side of the board. The key member is preferably elongated to afford remote installation of the socket assembly on the printed circuit board.

11 Claims, 12 Drawing Figures

LAMP SOCKET ASSEMBLY FOR MOUNTING ON PRINTED CIRCUIT BOARD

DESCRIPTION

1. Technical Field

The invention relates to a lamp socket assembly and more specifically to a lamp socket assembly for mounting on a printed circuit board. More specifically still, the invention relates to a twopiece lamp socket assembly for use in mounting a lamp on a printed circuit board in solderless electrical contact therewith.

2. Background Art

Small lamps, as for example of the incandescent type, are used in a large variety of lighting applications, as for instance the illumination of display panels. To that end, a variety of lamp socket configurations have been developed to suit those needs. One general type of lamp socket assembly includes discrete electrical contact elements as part of the assembly. This type of lamp socket assembly is typified by U.S. Pat. Nos. 3,0175,599; 3,050,705; 3,324,442; 3,555,341; 3,604,919; 3,614,712; 3,699,328; 3,798,588; 3,873,176; 4,076,358; 4,100,448 and 4,318,158. In addition to including discrete terminal elements, those assemblies typically include at least a socket, and in certain instances may also include a socket holder. In still other instances, those lamp socket assemblies may provide for some resilient displacement of one of the elements of the lamp and socket assembly. Certain of the aforementioned patents disclose lamp socket assemblies suited for use with a printed circuit, as for instance, U.S. Pat. Nos. 3,324,442; 3,555,341; 3,798,588; and 4,076,358.

Another form of lamp socket assembly which is particularly suited for mounting on printed circuit boards in automotive vehicles utilizes the leads extending from the lamp to provide direct electrical contact with the printed circuit board. Examples of such lamp sockets are illustrated in U.S. Pat. Nos. 2,892,992; 3,447,016; 3,511,982; 4,152,622; 4,193,653 and 4,299,430. Indeed, the lamp and lamp holder configurations of the aforementioned U.S. Pat. Nos. 4,193,653 and 4,299,430 are relatively simple, economical and effective in being mountable to a printed circuit board; however, they are limited in that they rely on an interference fit to provide electrical contact and are generally unable to compensate for variations in circuit board thicknesses and/or manufacturing tolerances.

Most, if not all, of the aforementioned lamp socket assemblies are intended for uses in which the printed circuit board or other support surface is relatively accessible. Further, the size of the lamps and respective socket assemblies are such as to facilitate their installation on a circuit board in a manner that enables good electrical contact to be maintained. However, in certain applications, as in the illumination of control elements and displays on the steering column in certain new automotive configurations, the space and mounting considerations may preclude use of lamp socket assemblies constructed in accordance with the aforementioned patents.

Specifically, in one automotive application the lamp is to be of a subminiature incandescent type referred to as a T-1 having a diameter of approximately 3 mm. The lamp and socket assembly are required to be mounted to a printed circuit board; however the printed circuit board is remotely located by 25-30 mm from an access opening in a cover panel. The lamp and assembly are required to pass through a 10 mm diameter hole and still provide an electrical connection of good integrity with the printed circuit boards which may vary somewhat in thickness. Further still, it is necessary that the lamp be capable of installation, removal and replacement without dismantling the surrounding housing. Finally, it is required that the lamp socket assembly be capable of relatively low cost, manufacture and assembly.

While some of the lamp holder assemblies of the aforementioned patents possess certain ones of the desired characteristics, none possesses them all.

DISCLOSURE OF INVENTION

Accordingly, it is a principal object of the present invention to provide an improved lamp socket assembly adapted to be mounted on a printed circuit board. Included within this object is the provision of a lamp socket assembly of relatively small cross-sectional dimension which is capable of being installed on a remotely positioned printed circuit board so as to provide and maintain electrical connections of high integrity over a range of variable thicknesses of the circuit board.

It is a further object of the present invention to provide such an improved lamp socket assembly which is readily capable of installation, removal and replacement.

It is a still further object of the present invention to provide such an improved lamp socket assembly which is capable of relatively low cost to manufacture and which facilitates installation of the lamp.

In accordance with the invention, there is provided a lamp socket assembly adapted to be mounted on one side of a printed circuit with a tubular portion thereof extending through a small notched aperture in the printed circuit board. The lamp socket assembly includes a socket and a separate key member, the key member being adapted to receive the socket in latched relation therewith near its forward end. The socket has a substantially tubular portion of small diameter adapted to extend forwardly through the aperture in the printed circuit for receiving a lamp having electrical leads. The socket also includes a base flange, formed near its rearward end, of sufficient diameter to underlie a part of the printed circuit board when the socket is installed in the aperture of the printed circuit board. The electrical leads from the lamp pass between the upper surface of the socket flange and the undersurface of the printed circuit board for providing the requisite electrical contact with the printed circuit when the socket is urged upwardly. The key member and the socket include complementary latching means, as for instance a detent and a slot of recess combination, for latching the socket to the key member in a manner allowing limited relative longitudinal displacement therebetween. Biasing means integrally formed with the socket, or preferably with the key member, act to urge the socket forward longitudinally relative to the key member. The key member includes a securing member or lock, such as one or more camming surfaces, for insertion into the printed circuit aperture and subsequent twisting with the key member to lock the socket assembly on the printed circuit board such that the socket flange urges the lamp leads into electrical contact with the circuitry on the undersurface of the printed circuit board. The key member is preferably elongated to facilitate installation of the assembly in a remotely positioned printed circuit board. A variety of utilization configurations may be provided for by using a standardized socket and varying the shape (e.g., length) of only the key.

Both the socket and the key member are preferably formed of molded plastic. The biasing means may be provided by a pair of spring fingers cantilevered from the forward end of the elongated key member. A pair of spaced arms extend forwardly from the forward end of the key member for retaining the socket therebetween in its latched relation. The retaining arms are arranged in quadrature with the cantilevered spring fingers. The retaining arms include flat, inwardly facing, longitudinally-extending surfaces and the socket includes complementary, flat, outwardly-facing surfaces extending longitudinally of the socket for close facing relation with the respective flat surfaces on the key member retaining arms when the socket is moved into latched relation with the key member.

BEST MODE FOR CARRYING OUT THE INVENTION

Figure 1:
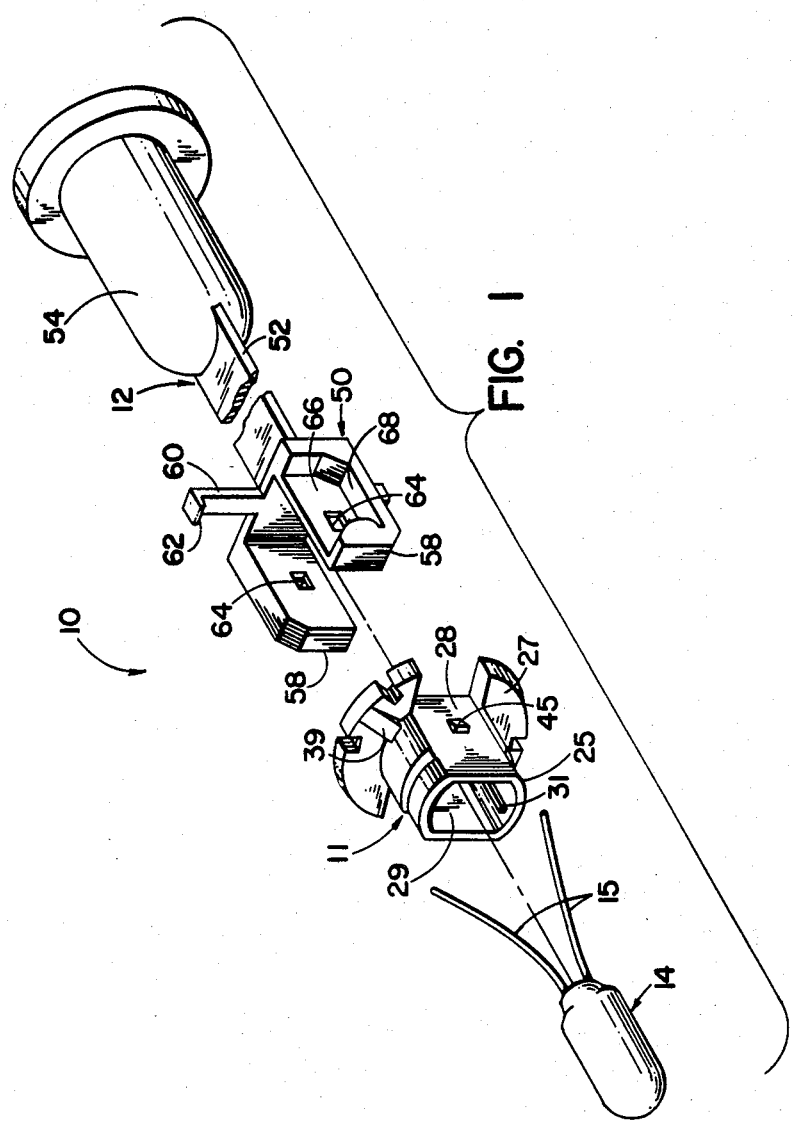
FIG. 1 is an exploded perspective view of the lamp socket assembly and lamp of the invention.
Figure 2:
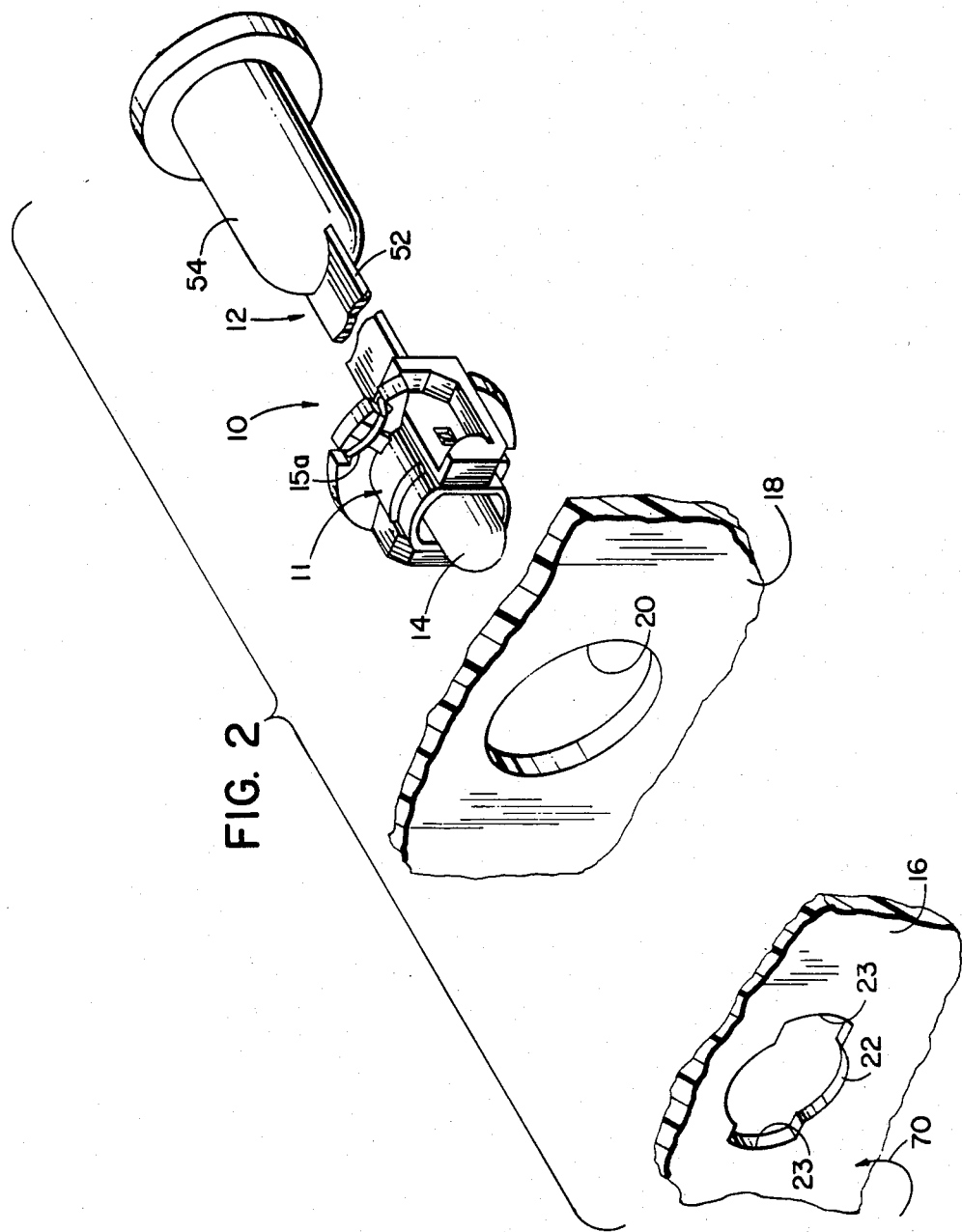
FIG. 2 is a perspective view of the lamp socket assembly and lamp of the invention preparatory to mounting through a panel and onto a printed circuit board.

Referring to the drawings and particularly to FIGS. 1 and 2, there is illustrated a two-piece lamp socket assembly 10 comprising a lamp socket 11 and a mounting member or key 12, each preferably formed of molded plastic. The lamp socket 11 is capable of receiving and supporting a small lamp 14 having a pair of conductive electrical leads 15. The lamp socket 11 is captively mounted on and supported by the key 12 in accordance with the invention. The key 12, with the lamp socket supported thereby, may in turn be mounted on a printed circuit board 16 in accordance with the invention.

In certain applications, the printed circuit board 16 is spaced inwardly from a cover or panel 18 by a significant distance, as for instance, 25 mm or more. In order to mount the lamp socket assembly 10 with lamp 14 onto printed circuit board 16, the lamp and substantially all of the socket assembly are passed through a clearance opening 20 in the cover 18 and at least partly through an aperture 22 with notches or cutouts 23 in the printed circuit board. As used herein, the lamp 14 is intended to extend beyond an upper or forward surface of the printed circuit board 16, the opposite surface of that board being referred to as the rear or undersurface. A certain portion 15a of the electrical leads 15 from lamp 14 pass over an upper surface of the lamp socket 11 and are adapted to be maintained in electrically conductive contact with respective conductive contact patterns printed on the undersurface of the printed circuit board 16, as will be hereinafter evident.

Figure 8:
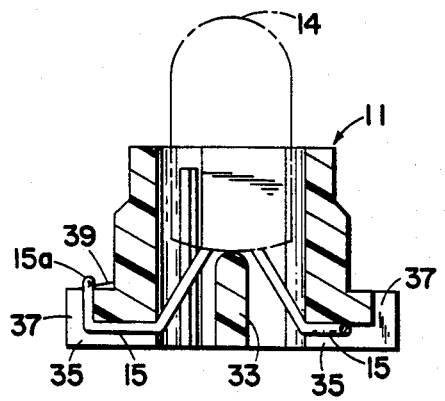
FIG. 8 is a sectional view of the socket taken along line 8—8 of FIG. 6 and showing a lamp installed therein.

The lamp socket 11 includes a generally circular tubular portion 25 extending upwardly or forwardly from a radially enlarged base or flange portion 27. A pair of flats or slots 28, formed in opposite sides of the outer wall of the socket 11, extend its full length. The corresponding inner walls of the socket 11 also are flattened for its entire length such that the socket cavity 29 is generally oblong in cross section. A pair of diametrically opposed support fins 31 extend along much of the length of the socket cavity 29 and serve to center and radially support the lamp 14 when it is installed within the socket cavity. A septum 33 extends generally diametrically across the lower or base portion of the socket cavity 29 for electrically separating the lamp leads 15 and for supporting the lamp 14 at its lower end when installed in the socket, as illustrated in FIG. 8. The base of lamp socket cavity 29 is open on either side of septum 33 to facilitate insertion and passage of the leads 15.

Figure 7:
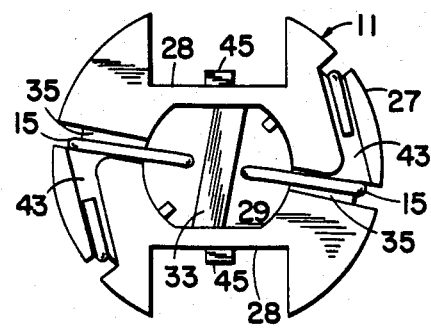
FIG. 7 is an under side or rear end view of the socket showing the electrical leads operatively positioned thereon.
Figure 9:
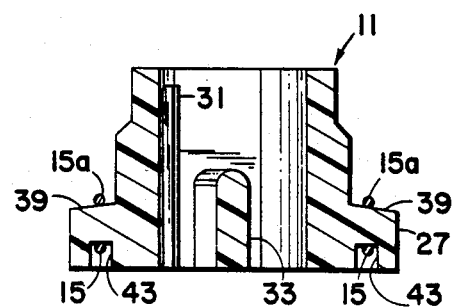
FIG. 9 is a sectional view of the socket taken along 9—9 of FIG. 6.

The lamp leads 15 are anchored to the socket 11 and disposed so as to provide the requisite electrical contact with the printed circuitry on the undersurface printed circuit board 16 generally in the manner disclosed in the aforementioned U.S. Pat. Nos. 4,193,653 and 4,299,430. More specifically, the lamp leads 15 extend from the base of the lamp 14 radially outward in respective diametrically opposed radial grooves 35 formed in the undersurface of the socket flange 27. The leads 15 then extend upwardly in respective diametrically opposed slots 37 formed in the outer periphery of the socket flange 27. Then portion 15a of the respective lamp leads extend over respective ridges or projections 39 formed at diametrically opposite positions on the upper surface of the socket flange 27. Finally, the lamp leads 15 pass downwardly through a respective pair of opposed slots 41 in the periphery of flange 27 and then terminate in chordal grooves 43 formed in the undersurface of socket flange 27 as illustrated in FIGS. 7 and 9. The anchoring of the lamp leads 15 is done in a known manner, either manually or automatically.

The lamp 14 is relatively small, being a so-called T-1 bulb having a diameter of only about 3 mm. In accordance with the invention, the cross-sectional geometry i.e., diameter, of the lamp socket assembly 10 is also relatively small, being less than about 10 mm at its maximum. Referring to FIG. 2, the opening 20 in cover 18 and the extreme diameter of aperture cutouts 23 on printed circuit board 16 are approximately 9.5 mm and the greatest diameter of the socket assembly 10 is approximately 9 mm. Still further, the central aperture 22 in printed circuit board 16 has a diameter of about 6.5 mm such that the outside diameter of the socket barrel 25 is about 6 mm. The diameter of socket flange 17 is about 9 mm except where the flats 28 reduce the transverse dimension of socket 11 to about 4.5 mm. A pair of ramped latch detent projections 45 are positioned on opposite sides of the socket 11 on the respective flats 28 and is outwardly inclined about 30° in the upward or forward direction along socket 11. Each detent projection 45 is slightly over 1 mm in width and 1 mm in the axial or longitudinal direction. As seen most clearly in FIG. 11, each detent 45 includes an upwardly or forwardly facing shoulder 47 formed by an end surface of the detent 45 extending substantially perpendicular to the length of socket 11.

Figures 4, 5:
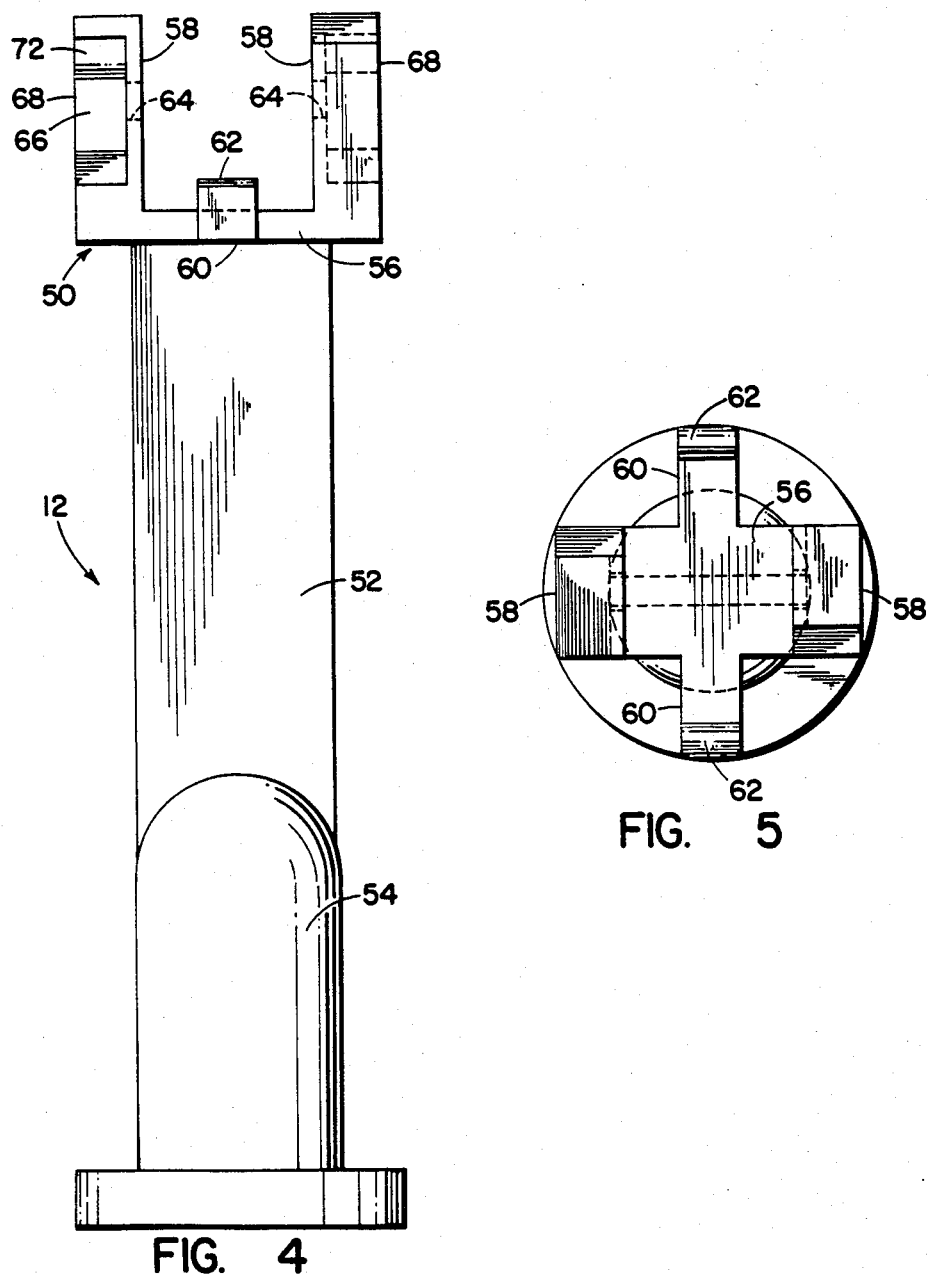
FIG. 4 is a side view of the key member of the lamp socket assembly.
FIG. 5 is top or front end view of the key member of FIG. 4.
Figure 6:
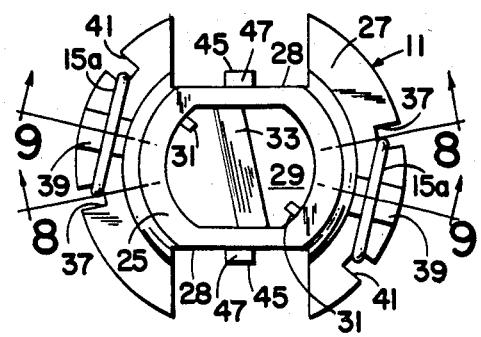
FIG. 6 is a top view of the socket of the assembly, showing electrical leads operatively positioned thereon.

Referring to the key 12, particularly as is illustrated in FIGS. 4 and 5, a socket-retaining portion, generally designated 50, is formed at the forward end of an extension arm 52, which in turn extends forwardly from a radially-enlarged tubular base portion 54. The socket-retaining portion 50 of key 12 includes a platform 56 disposed transversely of the extension arm 52 at its forward end, a pair of spaced parallel retaining arms 58 extending forwardly from a pair of opposite ends of the cruciform platform 56, and a pair of cantilevered spring fingers 60 extending first transversely and then forwardly from opposite sides of the platform 56 in quadrature with the retaining arms 58. The retaining arms 58 overlie the extension arm 52 such that the extension arm provides a degree of rigidity to the retaining arms in the direction of the longitudinal extent of the key 12. Conversely, the spring fingers 60 are cantilevered from the platform 56 in a manner which provides them with resiliency longitudinally of the key 12. Each spring finger 60 includes an upwardly or forwardly extending tip 62 for engaging the undersurface of lamp socket 11 and resiliently urging or biasing the lamp socket upwardly or forwardly relative to key 12.

The spacing and dimensioning of arms 58 on key 12 are such that they closely embrace the lamp socket 11 therebetween. More specifically, the retaining arms 58 are sized and oriented such that they fit in close sliding relationship with the flats 28 along lamp socket 11. The interior facing surfaces of the retaining arms 58 are elongated, flat rectangles adapted for close facing relation with the respective flats 28 on the lamp socket 11. Relative rotation between socket 11 and key 12 is restricted because flange 27 prevents relative angular displacement of retaining arms 58. Importantly, each of the retaining arms 58 includes a recess or notch 64 adapted to receive a respective detent projection 45 of lamp socket 11, thereby to provide complementary latching arrangement. Each notch 64 is only slightly wider than the respective detent projection 45. Importantly also, the longitudinal extent of the notches 64 is sufficient to allow some relative longitudinal movement between the lamp socket 11 and the key 12 for accommodating variations in circuit board thickness and manufacturing tolerances. In the illustrated embodiment the notch 64 is a 1 mm square hole.

Figure 10:
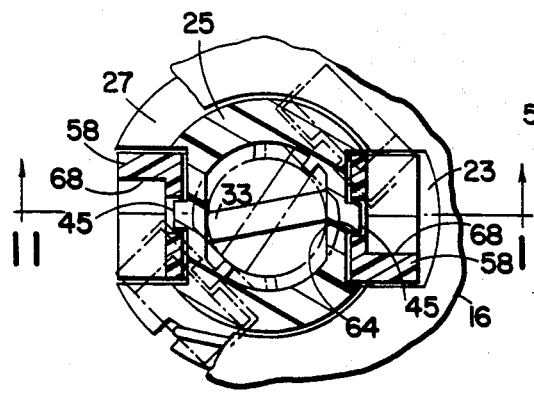
FIG. 10 is a view, partly broken away and partly in section, taken transversely of the longitudinal extent of the lamp socket assembly and showing the FIG. 3A orientation in solid line and the FIG. 3B orientation in phantom.
Figure 11:
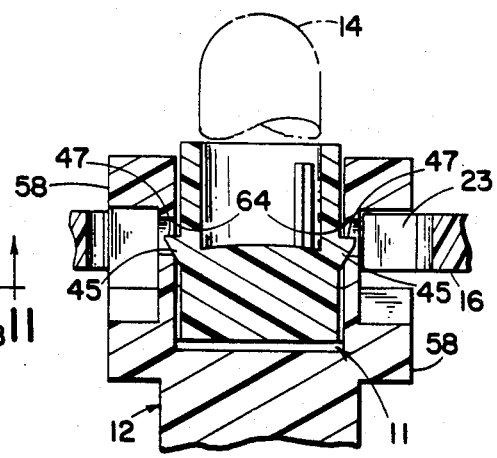
FIG. 11 is a partial, longitudinal sectional view of the lamp socket assembly.

To assemble the lamp socket assembly 10, the lamp 14 is first installed in the socket 11 as previously described. Then, the socket 11 and the key 12 are moved longitudinally relatively toward one another such that the socket is received between the arms 58 of key 12. The socket 11 is moved relatively downward between the arms 58 of key 12 until the upper shoulder 47 of its detents 45 move into registry with the upper edge of the notches 64 in the arms 58. The distance between the ends of the opposite projections 45 is slightly greater than the normal spacing between the interior surfaces of the respective arms 58 such that those arms are forced slightly apart while the socket 11 is moved relatively downward therebetween. When the upper end of the projections 45 move into registry with the upper ends of the notches 64, the slightly-flexed-apart arms 58 may return to their normally parallel orientations with the detents received in the notches as illustrated in FIGS. 3A, 10 and 11, and the socket 11 and key 12 are latched to one another.

Figure 3A:
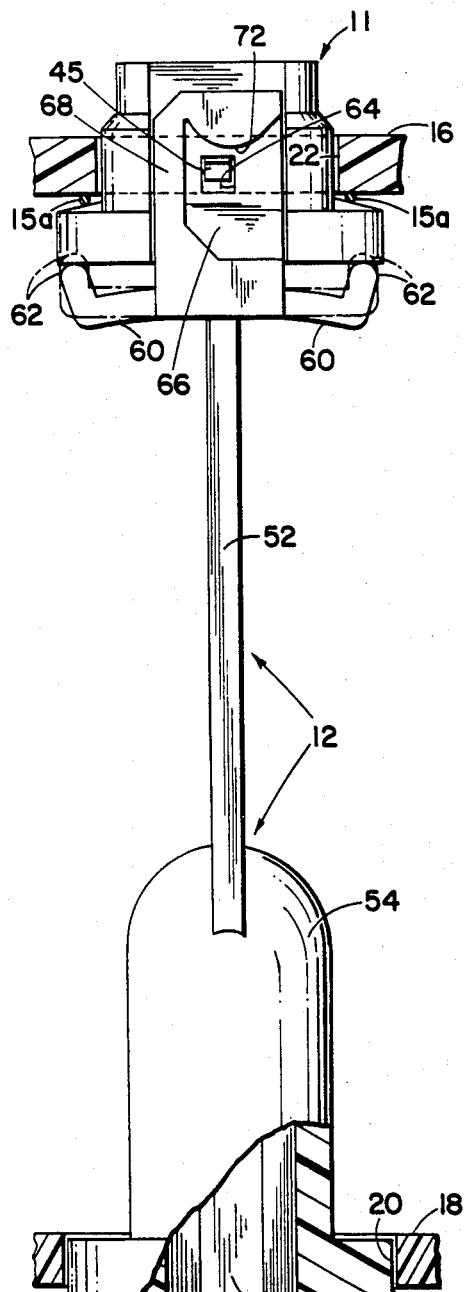
FIG. 3A is a side view, partly in section, of the lamp socket assembly prior to final locking on the printed circuit board.

Referring briefly to FIG. 3A, it will be understood that the relative longitudinal positioning of the upper ends of the tips 62 of springs 60, of the shoulders 47 of detents 45 and of the upper edge of notches 64 are such that the spring fingers 60 are flexed downwardly from their normal position (shown by broken line) to the position illustrated in solid line in the figure when the detent first enters the notch. Accordingly, the tip 62 of spring fingers 60 urge the lamp socket 11, and thus its detents 45, upwardly to their limited position against the upper edge of notch 45. In this configuration, the lamp socket assembly 10 is then ready for insertion through the opening 20 in cover 18 and installation in printed circuit board 16.

Referring to the Figs. illustrating key 12, it will be seen that each of the arms 58 of key 12 is relieved in an opposite direction to create a respective cavity or slot 66 bounded by a respective back wall 68. The mouths of the respective slots 66 open in opposite directions about an axis of rotation extending longitudinally through the key 12 such that rotation of the key about that axis in the direction indicated by arrow 70 in FIG. 2 will allow a portion of the printed circuit board 16 to relatively enter thereinto. Further still, the upper or outer end of each arm slot 66 is bounded by a generally-downwardly-facing securing member, such as camming surface 72, for securing the lamp socket assembly 10 to the printed circuit board 16.

Referring to FIGS. 2, 3A, 3B and 11, the lamp socket assembly 10 is inserted through the opening 20 in cover 18 and moved longitudinally until the lamp 14 passes through the opening 22 in the circuit board 16. In a particular example, the printed circuit board 16 and the cover panel 18 are spaced approximately 28 mm from one another. The overall length of key 12 is about 33 mm, with the extension arm 58 being about 12–15 mm and the base portion 54 being about 11–13 mm. The base portion 54 of key 12 includes a hexagonal cavity 71, as seen in FIG. 3A, for receiving a standard turning tool, such as an Allen wrench, though alternative turning mechanisms might also be used. The assembly 10 is then rotated in either direction until the radial projections formed by the arms 58 of key 12 are in alignment with the cutouts 23 in the circuit board opening to allow further insertion of the assembly to the position illustrated in FIG. 3A. In this position, the portions 15a of lamp leads 15 are in general electrical contact with the printed patterns (not shown) on the undersurface of the printed circuit board 16. It remains then for the assembly 10 to be rotated in the direction indicated by the arrow 70 in FIG. 2, which is to the right in FIG. 3A, so as to bring the camming surface 72 into engagement with the printed circuit board 16 and draw the key 12 upward relative to the printed circuit board.

Figure 3B:
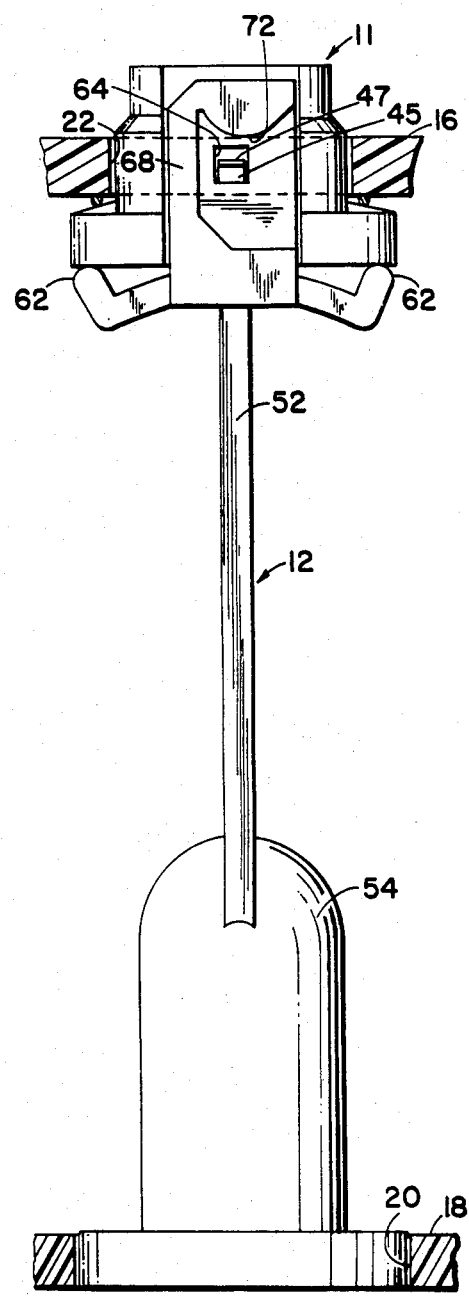
FIG. 3B is a side view, partly in section, of the lamp socket assembly as finally mounted on the printed circuit board.

The key 12 is capable of approximately 30° rotation from its position illustrated in FIG. 3A to a position in which the rear walls 68 of each of the slots 66 in arms 58 move into limiting engagement (not shown) with an edge of the printed circuit board 16. As the key 12 is rotated, the leading edge of its camming surface 72 engages the upper edge of the opening on the printed circuit board 16. Continued rotation of the key 12 and its camming surface 72 cause upward displacement of the key 12 relative to the printed circuit board. The general thickness of the printed circuit board 16, the depth of the camming surface 72 and the available angular extent of rotation of the key are typically selected such that when the back wall 68 engages the printed circuit board, the lowermost point of camming surface 72 is engaging the upper surface of the printed circuit board represented by dotted lines in FIG. 3B. It should be understood that the view of FIG. 3B is rotated about 30° rightward from that of FIG. 3A so as to follow the rotation of the assembly 10; however, the phantom illustration in FIG. 10 reveals the actual angular orientations of assembly 10 and board 16 in the final, locked position.

In this final position, the key 12 will have moved upward relative to its position illustrated in FIG. 3A such that the bottom flange on its base portion 54 is flush with or slightly recessed in the cover 18. The diameter of the flange on the base portion 54 is only slightly less than that of opening 20 in cover 18 so as to minimize bothersome "light leaks" and enhance the general aesthetics. Importantly also, such upward movement of the key 12 relative to the printed circuit board 16 and the lamp socket 11 serves to additionally flex the spring fingers 60, thereby increasing the upwardly-directed resilient biasing forces on the under surface of the socket 11. This ensures the maintenance of good electrical contact between the lamp leads 15a and the printed circuit 16, even over a limited range of variations in circuit board thickness. For instance, a nominal thickness of circuit board 16 may be 1.5 mm with the tolerance being ±0.125 mm, and the present socket assembly 10 is easily capable of maintaining secure engagement despite such variations in board thickness.

Although this invention has been shown and described with respect to detailed embodiments thereof, it will be understood by those skilled in the art that various changes in form and detail thereof may be made without departing from the spirit and scope of the claimed invention.

Having thus described a typical embodiment of the invention, that which is claimed as new and desired to be secured by Letters Patent of the United States is:

1. A lamp socket assembly adapted to be mounted on one side of a printed circuit with a tubular portion thereof extending through a small aperture with cutouts in the printed circuit, comprising:
   a socket having a substantially tubular portion thereof of small diameter adapted to extend forwardly through said aperture in said printed circuit for receiving a lamp having electrical lead means;
   a key member adapted to receive said socket in latched relation therewith near the forward end of said key member;
   a base flange formed near the rearward end of said socket, at least part of said flange being of greater diameter than at least part of said aperture in said printed circuit and including a forward-facing surface for supporting said lamp electrical lead means thereon for contact with a rearward-facing surface of the printed circuit;
   said key member and said socket including complementary latching means for latching said socket to said key member in a manner allowing limited relative longitudinal displacement therebetween;
   biasing means being integrally formed with one of said key member and said socket and disposed to engage the other of said key member and said socket for urging said socket forward longitudinally relative to said key member; and
   said key member including a securing member disposed thereon for insertion into said printed circuit aperture and subsequent twisting with said key member to lock said socket assembly on said printed circuit board such that said socket flange urges the lamp electrical lead means into said contact with the printed circuit board.

2. The lamp socket assembly of claim 1 wherein said biasing means is formed integrally with said key member.

3. The lamp socket assembly of claim 2 wherein said key member is of molded plastic.

4. The lamp socket assembly of claim 1 wherein said biasing means comprises at least one cantilevered spring finger.

5. The lamp socket assembly of claim 2 wherein said biasing means comprises at least two cantilevered spring fingers.

6. The lamp socket assembly of claim 5 wherein said key member includes a pair of spaced, forwardly-extending arms near its forward end for retaining said socket therebetween said latched relation.

7. The lamp socket assembly of claim 6 wherein said key member arms each include flat, inwardly-facing, longitudinally-extending surfaces and said socket includes complementary, flat, outwardly-facing surfaces extending longitudinally of the socket for close facing relation with the respective said flat surfaces on the key member retaining arms when said socket is moved longitudinally relative to said key member into said latched relation.

8. The lamp socket assembly of claim 7 wherein said cantilevered spring fingers are positioned in quadrature with said key member arms.

9. The lamp socket assembly of claim 6 wherein said key member includes a base portion for receiving a turning force and an elongated extension portion extending from said base portion, and wherein said retaining arms and said spring members extend from the forward end of said extension portion such that said socket may be mounted on a remotely positioned printed circuit board.

10. The lamp socket assembly of claim 1 wherein said latching means comprise ramped detent means on one of said key member and said socket and means defining respective detent-receiving slots in the other of said key member and said socket.

11. The lamp socket assembly of claim 7 wherein said latching means comprise a detent projection ramped outwardly in the forward direction on each of said socket flat surfaces and a respective detent-receiving slot in said flat surfaces of each respective key member retaining arm.

* * * * *